(12) United States Patent
Shibuya

(10) Patent No.: US 9,928,998 B2
(45) Date of Patent: Mar. 27, 2018

(54) SPUTTERING APPARATUS

(71) Applicant: CANON ANELVA CORPORATION, Kawasaki-shi (JP)

(72) Inventor: Yohsuke Shibuya, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 15/045,639

(22) Filed: Feb. 17, 2016

(65) Prior Publication Data

US 2016/0247667 A1    Aug. 25, 2016

Related U.S. Application Data

(60) Division of application No. 13/922,353, filed on Jun. 20, 2013, which is a continuation of application No. PCT/JP2011/007275, filed on Dec. 26, 2011.

(30) Foreign Application Priority Data

Dec. 28, 2010    (JP) ................................ 2010-292111

(51) Int. Cl.
    *C23C 14/34*      (2006.01)
    *H01J 37/34*      (2006.01)
    (Continued)

(52) U.S. Cl.
    CPC ............ *H01J 37/3476* (2013.01); *B08B 7/00* (2013.01); *C23C 14/3407* (2013.01);
    (Continued)

(58) Field of Classification Search
    CPC ............................ H01J 37/3476; C23C 14/35
    See application file for complete search history.

(56) References Cited

U.S. PATENT DOCUMENTS 5,944,968 A    8/1999    Kobayashi et al.
6,228,236 B1    5/2001    Rosenstein et al.
(Continued)

FOREIGN PATENT DOCUMENTS

JP    62-047476 A    3/1987
JP    09-209141 A    8/1997
(Continued)

OTHER PUBLICATIONS

International Preliminary Report on Patentability in PCT/JP2011/007275, dated Jul. 11, 2013 (5 pages).
(Continued)

*Primary Examiner* — John J Brayton
(74) *Attorney, Agent, or Firm* — Fitzpatrick, Cella, Harper & Scinto

(57) ABSTRACT

The present invention provides a means capable of determining the surface state of the target to execute accurate and quick cleaning of necessary part. The means includes: a magnet unit capable of forming a magnetic field on the surface of a target; a rotary system capable of driving the magnet unit to change the magnetic field pattern; and an ammeter configured to measure target current when the magnetic field is formed by the magnet unit and discharge voltage is applied to a target electrode to which the target is attached. The position of the magnet unit is variously changed by the rotary system, and the target current is measured at each position and compared with a reference value. It is then determined whether cleaning is necessary at each position, so that cleaning can be performed only for necessary part.

10 Claims, 12 Drawing Sheets

(51) Int. Cl.
*C23C 14/56* (2006.01)
*C23C 14/35* (2006.01)
*B08B 7/00* (2006.01)

(52) U.S. Cl.
CPC .......... *C23C 14/3414* (2013.01); *C23C 14/35* (2013.01); *C23C 14/564* (2013.01); *H01J 37/3405* (2013.01); *H01J 37/3455* (2013.01); *H01J 37/3461* (2013.01); *H01J 37/3482* (2013.01); *H01J 37/3485* (2013.01)

(56) References Cited

U.S. PATENT DOCUMENTS

| | | |
|---|---|---|
| 7,686,926 B2 | 3/2010 | Gung et al. |
| 8,252,118 B2 | 8/2012 | Shibuya et al. |
| 2009/0159428 A1 | 6/2009 | Miller et al. |
| 2011/0073463 A1* | 3/2011 | Ye ................... C23C 14/0036 |
| | | 204/192.15 |
| 2012/0161322 A1 | 6/2012 | Wakayanagi et al. |
| 2013/0277213 A1* | 10/2013 | Shibuya ............ C23C 14/3407 |
| | | 204/298.03 |

FOREIGN PATENT DOCUMENTS

| | | |
|---|---|---|
| JP | 10-088336 A | 4/1998 |
| JP | 11-152564 A | 6/1999 |

OTHER PUBLICATIONS

International Search Report in PCT/JP2011/007275, dated Mar. 13, 2012 (2 pages).

* cited by examiner

SPUTTERING APPARATUS

CROSS-REFERENCES TO RELATED APPLICATIONS

This application is a divisional application of U.S. patent application Ser. No. 13/922,353, filed Jun. 20, 2013, which is a continuation application of International Application No. PCT/JP2011/007275, filed Dec. 26, 2011, which claims the benefit of Japanese Patent Application No. 2010-292111, filed Dec. 28, 2010. The contents of the aforementioned applications are incorporated herein by reference in their entireties.

TECHNICAL FIELD

The present invention relates to a sputtering apparatus including a magnet unit.

BACKGROUND ART

Thin film formation by sputtering using a magnet, for example, magnetron sputtering, is capable of providing high-quality film and implementing high-speed film formation and therefore has been put into practical use in various fields. Manufacturing of semiconductor devices and electronic components is not exception, and the sputtering using a magnet is considered as an important technique influencing the characteristics of the devices and the like. In recent years, the semiconductor devices and electronic components have been rapidly increasingly sophisticated and highly integrated (made finer), and more exacting requirements have been imposed for quality of thin film, forming conditions, and the like. For example, sputtering has been required to form thin film with high quality (low resistance) on semiconductor substrates in the process of deposition. As an example of such sputtering apparatuses, an apparatus shown in Patent Document 1 has been proposed, for example.

In the case of thin film formation on a substrate by sputtering, the vacuum vessel is temporarily exposed to the atmosphere at periodic maintenance or the like, and in this case, an oxidized layer and the like are formed on the surface of the target. Moreover, when continuous deposition for a long total deposition time is performed, a re-deposited film of a target material adheres to a region with small erosion on the target surface (in other words, a region of the target surface having a low sputtering rate) in some cases. When thin film is formed without the above surface oxidized layer sufficiently removed, or when the film is formed while there remains the re-deposited film of the target material formed on the target surface due to the continuous film formation, the thin film formed on the substrate has a high specific resistance. Accordingly, thin film with good film quality cannot be formed, and there are problems including functional degradation of devices and reduction in yield. In order to form highly-sophisticated thin film, it is important to prepare a proper surface state of the target by performing adequate sputter cleaning.

An example of such sputter cleaning is a method shown in Patent Document 2. The example shown in Patent Document 2 discloses a technique of weakening a magnetic field formed on the target surface when performing target cleaning, thereby cleaning the entire surface of the target even when the entire surface is oxidized Furthermore, an example of conventional sputter cleaning apparatuses is described based on FIG. 17 (Patent Document 3). In FIG. 17, reference numeral 101 indicates a vacuum chamber; 102, a substrate holder; 103, a substrate; 104, an electrode; 105, a target; 106, a high-voltage power supply; 107, an ammeter; 108, a voltmeter; 109, a controller; 110, a power supply switch; and 111, a shutter. At main sputtering (deposition on the substrate) of the apparatus of FIG. 17, when the switch 110 is turned on, ions in plasma collide with the target 105 as a cathode, and atoms of the target 105 are ejected. These ejected atoms adhere to the substrate 103 to form film.

In the case of performing pre-sputtering (cleaning of the target surface) before the main sputtering, a dummy substrate 103 for pre-sputtering is attached to the substrate holder 102 (step S1), and first discharge (pre-sputtering 1) is performed only for a predetermined period of time. Next, second discharge (pre-sputtering 2) is performed (step S3). In this pre-sputtering 2, discharge is performed at higher power than the pre-sputtering 1. During the second discharge, the value of current flowing between the target 105 and dummy substrate 103 or the value of voltage across the same is measured at predetermined time intervals, and the measured values are monitored. Next, it is determined whether the monitored values of current or voltage are stabilized, that is, whether the value previously monitored is equal to the value currently monitored (step S5). When the currently monitored value of current or voltage is not equal to the value previously monitored, the discharge is continued, or otherwise, the discharge is stopped.

CITATION LIST

Patent Document

Patent Document 1: Japanese Patent No. 3935231
Patent Document 2: Japanese Patent Application Laid-Open No. 62-47476
Patent Document 3: Japanese Patent Application Laid-Open No. 11-152564

SUMMARY OF INVENTION

However, it is difficult to directly observe whether impurity layers formed on the target, including re-deposited film of the target material and surface oxidized layer, is sufficiently removed in a state where the target is placed within the vacuum vessel. Accordingly, a lot of time and effort are spent on the cleaning process that involves many trial-and-error elements. The thus-reduced apparatus utilization reduces the production volume of devices, and consequently increases the manufacturing cost of the devices. It has been therefore desired to establish a spatter cleaning method adequately and efficiently removing impurity layers generated on the target surface.

For example, the aforementioned method shown in Patent Document 2 can comparatively well remove the surface oxidized layer formed on the entire surface of the target but cannot sufficiently remove re-deposited substances of the target adhering to unspecified places. In order to remove re-deposited substances partially adhering, a considerable amount of sputter cleaning needs to be performed for the entire surface. This produces a waste of the target material and requires a certain time. Moreover, in the case of sputtering at high voltage without using a magnet, particles ejected by sputtering disperse in the vessel, thus leading to particle formation.

In the method of Patent Document 3, since the discharge characteristic changes as the target is consumed, there is a problem that it is not possible to know whether the oxidized layer (impurity layer) in the target surface is removed by sputter cleaning or the target is consumed. Specifically, according to the method described in Patent Document 3, because of magnetron discharge, the region of the target eroded by sputtering has a torus shape. In pre-sputtering of the target surface, the pre-sputtered region has a torus shape which is the same as the eroded region. Accordingly, based on a change in the discharge characteristic, it may be determined whether the oxide layer (impurity layer) on a portion of the target surface at the eroded torus-shaped region is removed. However, in the case where an oxidized layer (impurity layer) having the same thickness as that in the eroded torus-shaped region adheres to the target surface at a not-eroded region other than the torus-shaped region, it cannot be determined, based on the change in the discharge characteristics, whether the oxidized layer (impurity layer) on a portion of the target surface at the not-eroded region other than the torus-shaped region is already removed. Moreover, in Patent Document 3, the voltage and current values of removal discharge represent the behavior of electric charges flowing onto the target which is being sputtered. Accordingly, there is a problem that it is not possible to know whether the oxide film (impurity film) is sufficiently removed in the other region which is not sputtered, for example.

The present invention was made in the light of the aforementioned problems, and an object of the present invention is to provide a means capable of executing accurate and quick cleaning of necessary part of the target surface even in a region which is not sputtered.

As described above, a sputtering apparatus according to an embodiment of the present invention includes: a magnet unit capable of forming a magnetic field on the surface of a target; a changing unit capable of driving the magnet unit to change a magnetic field pattern including the position and intensity of the magnetic field formed on the surface of the target; a discharge state measuring unit configured to measure a discharge state value when discharge voltage is applied to a target electrode to which the target is attached; a memory unit configured to store a reference discharge state value acquired corresponding to each magnetic field pattern producible by the changing unit; a determination unit configured to determine the state of the surface of the target based on a comparison between the discharge state value measured by the discharge state measuring unit at a first magnetic field pattern and a discharge state reference value corresponding to the first magnetic firming pattern stored in the memory unit; and a controller configured to select a second magnetic field pattern, which is different from the first magnetic field pattern, based on the result of determination by the determination unit, control the changing unit to generate the second magnetic field pattern, and execute sputter cleaning.

The surface state of the target can be determined according to each magnetic field pattern changed by the changing unit. Accordingly, in response to specification of the position of the magnet unit corresponding to the magnetic field pattern, the magnetic field condition which can cancel out the above magnetic field patter can be selected. Furthermore, the sputtering apparatus includes the controller which, based on the determination result by the determination unit, selects the magnetic field pattern that can be canceled out with the magnetic field pattern as an object for determination by the determination unit and causes the changing unit to change the magnetic unit to the magnetic field pattern for execution of sputter cleaning. This allows quick and accurate sputter cleaning even for the target surface not sputtered.

According to the present invention, it is possible to reduce the time and effort required for sputter cleaning for removal of impurity layers, including a surface oxidized layer formed by exposure to the atmosphere and re-deposited film formed by continuous film formation. Accordingly, the problem of an increase in manufacturing cost of devices due to reduction in apparatus utilization can be solved.

DESCRIPTION OF EMBODIMENTS

Hereinafter, a description is given of an embodiment of the present invention.

[Configuration of Sputtering Apparatus]

Figure 1:
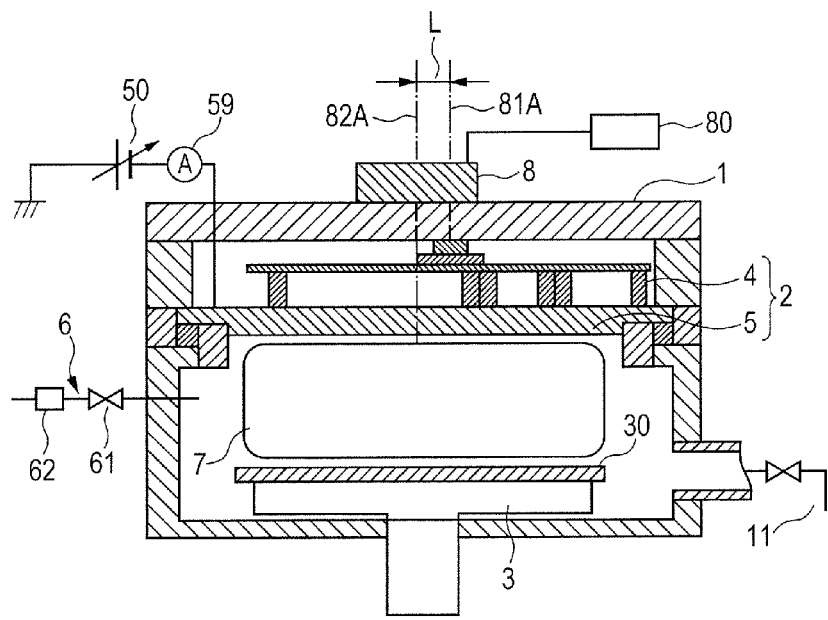
FIG. 1 is a view showing a schematic configuration of a sputtering apparatus of an embodiment.

FIG. 1 is a schematic view of a sputtering apparatus according to the embodiment of the present invention. The sputtering apparatus includes: a vacuum vessel 1; an exhaust system 11 for depressurizing the vacuum vessel 1; and a target electrode 2 placed at a predetermined position within the vacuum vessel 1. The sputtering apparatus further includes: a substrate holder 3 configured to place a substrate 30 at a predetermined position facing the target electrode 2; and a discharge gas introducing system 6 introducing discharge gas within the vacuum vessel 1.

The target electrode 2 configured as described above is placed together with the substrate 30 within a vacuum processing chamber so that the surface of a target 5 thereof faces the substrate 30 as an object of thin film formation, and sputtering gas is introduced. Thereafter, electric power is supplied to the target 5 by a high-voltage power supply 50 for glow discharge to generate high-density plasma 7 for sputtering, the plasma 7 being confined in a magnetic circuit formed by the magnet unit 4 in the target electrode 2. When ions in the plasma 7 are accelerated by the cathode sheath and collide with the target 5, constituent atoms of the target 5 are ejected from the target 5 by sputtering and then adhere to the surface of the substrate 30 to form thin film.

The target electrode 2 is composed of: the magnet unit 4 for implementing magnetron discharge; and the target 5 provided on the front of the magnet unit 4. The magnet unit 4 is configured to spin on a spin axis 81A and revolves around a revolution axis 82A by the rotary system 8 including a later-described mechanism. The rotary system 8 rotates the magnet unit 4 to change a magnetic field pattern formed on the surface of the target 5, including the position and intensity of the formed magnetic field.

Moreover, the sputtering apparatus of this embodiment includes the discharge gas introducing system 6 for introducing the discharge gas. The discharge gas introducing system 6 is configured to introduce normal discharge gas having a high sputtering rate, such as argon. The discharge gas introducing system 6 is composed of a valve 61 and a flow rate regulator 62, which are provided for a pipe connected to a not-shown tank, and the like.

Figure 2:
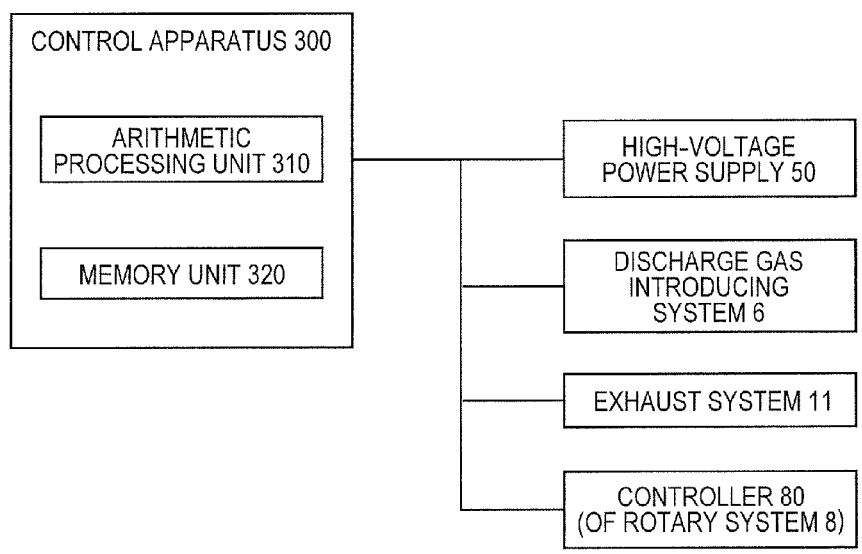
FIG. 2 is a functional block diagram of the sputtering apparatus.

As shown in FIG. 2, the sputtering apparatus of the embodiment further includes a control apparatus 300, which is connected to the high-voltage power supply 50, an ammeter 59, the discharge gas introducing system 6, the exhaust system 11, and a controller 80 of the rotary system 8. The control apparatus 300 includes: a memory unit 320 storing a control program; and an arithmetic processing unit 310 performing arithmetic processing based on the control program and executes predetermined deposition operation, determination of the need for cleaning, and cleaning operation. The control apparatus 300 is composed of a personal computer (PC), a microcomputer, or the like, for example.

The deposition operation is performed as follows, for example. First, a not-shown gate valve provided for the vacuum vessel 1 is opened, and the substrate 30 is delivered into the vacuum vessel 1 and placed on the substrate holder 3. After the vacuum vessel 1 is evacuated by the exhaust system 11 to $10^{-6}$ Pa or less, for example, the discharge gas introducing system 6 is activated. The material of the target 5 is tungsten (W), for example.

The discharge gas introducing system 6 is configured to introduce argon, for example. The discharge gas introducing system 6 introduces argon into the vacuum vessel 1 at a flow rate of about 100 sccm, for example. The target electrode 2 is activated in this state. Specifically, the rotary system 8 provided for the magnet unit 4 is activated while the high-voltage power supply 50 provided for the target 5 is activated, so that the magnet unit 4 performs predetermined rotation while predetermined negative DC voltage is applied to the target 5 for sputtering discharge. The negative DC voltage given by the high-voltage power supply 50 is about −400 V, for example. By such sputtering discharge, the target 5 is sputtered, so that predetermined thin film is formed on the substrate 30. After thin film is deposited in such a manner, the operation of the target electrode 2 and gas introducing system is stopped, and then the substrate 30 is taken out from the vacuum vessel 1.

The cleaning operation is performed during the process of replacement of the target, during continuous film formation, and at a certain time after the deposition operation is stopped. The cleaning operation, which is described later, is capable of cleaning any place that requires cleaning because the magnet unit 4 is attached so as to spin and revolve to form a magnetic field all over the surface of the target in this embodiment. Furthermore, whether cleaning is adequate can be determined based on a discharge reference value set according to the state of the formed magnetic field. It is therefore possible to quickly determine termination of cleaning and reduce the down time accordingly.

[Configuration and Operation of Rotary System]

Figure 3:
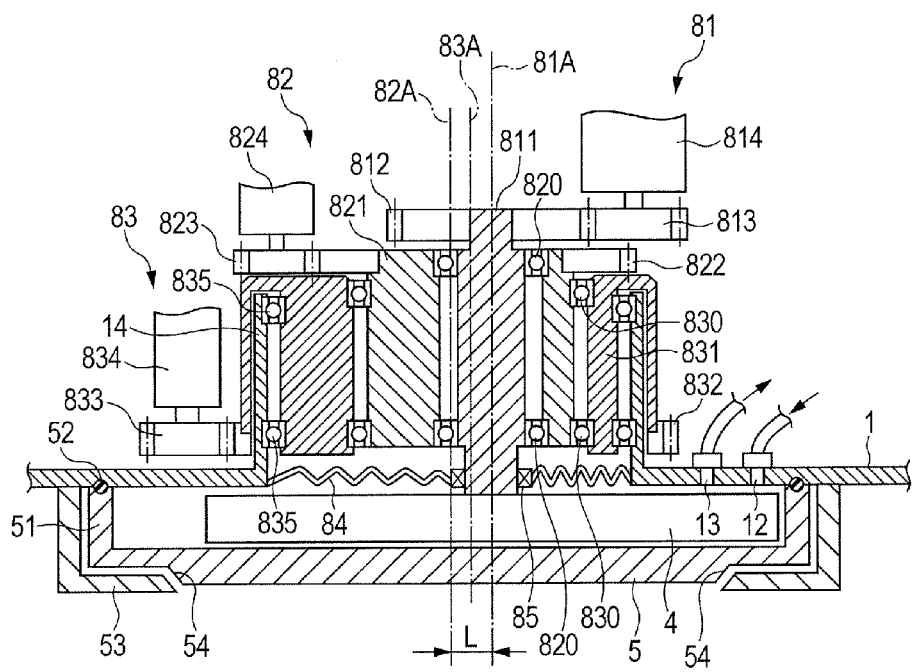
FIG. 3 is a schematic front cross-sectional view showing the detail of the configuration of a rotary system 8 of the apparatus of FIG. 1.

The configuration of the above-described rotary system 8 is described in detail using FIG. 3. FIG. 3 is a schematic front cross-sectional view showing the detail of the configuration of the rotary system 8 in the apparatus of FIG. 1. As shown in FIG. 3, the rotary system 8 is mainly composed of: a spin mechanism 81 rotating the magnet mechanism 4 on a spin axis 81A, which is the central axis of the magnet mechanism 4; a revolution mechanism 82 rotating the magnet mechanism 4 around a revolution axis 82A, which is coincident with the central axis of the target 5; and a rotation mechanism 83 rotating the spin mechanism 81 and revolution mechanism 82 around a rotation axis 83A different from the spin axis 81A and revolution axis 82A. The central axis of the target 5 and the revolution axis 82A coincident therewith do not need to be coincident with each other.

First, the configuration of the spin mechanism 81 is described.

The spin mechanism 81 is mainly composed of: a holding pole 811 fixed to the back of the magnet mechanism 4; a spin first gear 812 fixed to an end of the holding pole 811; a spin second gear 813 engaged with the spin first gear 812; a spin drive source (a spin speed changing mechanism) 814 rotating the spin first gear 813, such as a motor. As shown in FIG. 3, the holding pole 811 is fixed to the back of the magnet mechanism 4 so that the central axis of the holding pole 811 is coincident with the spin axis 81A. When the spin drive source 814 is driven, the holding pole 811 rotates through the spin second and first gears 813 and 812, so that the entire magnetic mechanism 4 spins on its axis.

Next, the revolution mechanism 82 is described.

The revolution mechanism 82 is mainly composed of: a revolution bushing 821 provided so that the holding pole 811 is inserted therethrough; a revolution first gear 822 provided at an end of the revolution bushing 821; a revolution second gear 823 engaged with the revolution first gear 822; and a revolution drive source (a revolution speed changing mechanism) 824 coupled to the revolution second gear 823.

The revolution bushing 821 includes a cylindrical internal space with a diameter slightly larger than that of the holding pole 811 and allows the holding pole 811 to be inserted through the internal space. Between the revolution bushing 821 and holding pole 811, as shown in FIG. 3, two bearings 820 are provided at the top and bottom. When the revolution drive source 824 is driven, the revolution bushing 821 is rotated through the revolution second and first gears 823 and 822, so that the holding pole 811 and spin drive source 814 rotate around the revolution axis 82A as a whole. The magnetic mechanism 4 therefore rotates around the revolution axis 82A.

Next, the configuration of the rotation mechanism 83 is described.

The rotation mechanism 83 of the apparatus of the present invention is mainly composed of: a rotation bushing 831 through which the revolution bushing 821 is inserted; a rotation first gear 832 fixed on the outer side surface of the rotation bushing 831; the rotation first gear 832 fixed to the outer side surface of the rotation bushing 831; a rotation second gear 833 engaged with the rotation bushing 832; and a rotation drive source 834 coupled to the rotation second gear 833.

The rotation bushing 831 includes a cylindrical internal space with a diameter slightly larger than the outer diameter of the revolution bushing 821, and the revolution bushing 821 is inserted through the internal space. Between the rotation bushing 831 and revolution busing 821, two bearings 830 are provided at the top and bottom as shown in FIG. 3.

As shown in FIG. 3, an attachment plate 14 is provided for part of the wall of the vacuum vessel 1 in which the above-described rotary system 8 is provided. The attachment plate 14 protrudes vertically. The attachment plate 14 is provided in peripheral part of the rotation bushing 831 as shown in FIG. 3. In the peripheral part of the rotation bushing 831, a circumferential recess, in which the attachment plate 14 is located, is formed as shown in FIG. 3. The recess and attachment plate 14 have cylindrical shapes around the rotation axis 83A.

With the aforementioned structure, the rotation bushing 831 is rotatably held by the attachment plate 14 with a bearing 835 interposed therebetween. When the rotation drive source 834 is driven, the rotation bushing 831 rotates through the rotation second and first gears 833 and 832. This rotation allows the spin mechanism 81 and revolution mechanism 82 to integrally rotate around the rotation axis 83A.

The rotation axis 83A of the rotation by the rotation mechanism 83 is set to a position different from the revolution axis 82A, and the revolution axis 82A and spin axis 81A therefore rotate around the rotation axis 83A. In this process, by properly setting the rotation speeds of spin and revolution, the positional relationship between the spin axis 81A and revolution axis 82A periodically changes. Along with rotation, the eccentric distance L of the spin axis 81A from the central axis of the target changes. In other words, when the central axis of the target is coincident with the revolution axis 82A, the eccentric distance L is equal to the distance between the revolution axis 82A and spin axis 81A.

The rotary system 8 including the aforementioned mechanisms is provided with the controller 80. The controller 80 is mainly composed of: a controller controlling the operation of each mechanism of the rotary system 8; an input unit that receives a signal to the controller; a computer calculating an operation state to be taken by each mechanism based on an instruction inputted into the input unit; and the like.

Figure 4:
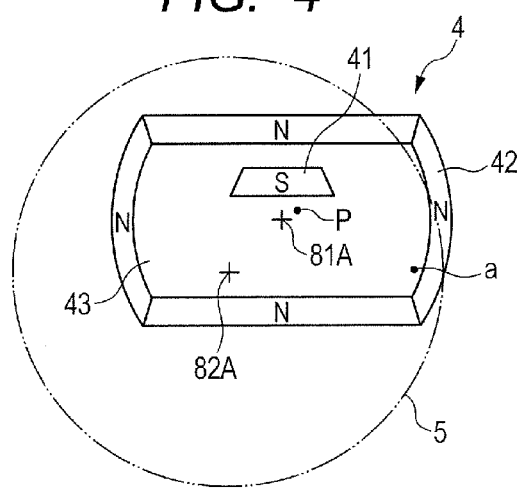
FIG. 4 is a plan view showing the detail of a magnet unit included in the sputtering apparatus of this embodiment shown in FIGS. 1 and 3.

Next, a description is given of formation of erosion in detail using FIGS. 4, 5A to 5C, and 6A to 6C. FIG. 4 is a plan view showing the detail of the magnet mechanism used in the sputtering apparatus of the embodiment shown in FIGS. 2 and 3. FIGS. 5A to 5C and 6A to 6C are schematic views illustrating trajectories of a point on the magnet mechanism during spin and revolution of the magnet mechanism.

First, as shown in FIG. 4, the magnet mechanism 4 in the apparatus of the embodiment includes: a central magnet 41 located near the center; a circumferential peripheral magnet 42 surrounding the central magnet 41; and a yoke 43 supporting the central magnet 41 and peripheral magnet 42 on the front surface and link the same.

The central magnet 41 is a columnar member having a trapezoidal planar view as shown in FIG. 3. The peripheral magnet 42 is a circumferential magnet having a substantially rectangular profile slightly bulging right and left. As shown in FIG. 4, for example, the surface of the central magnet is an S pole and the surface the peripheral magnet 42 is an N pole, so that arch-shaped magnetic field lines are set from the peripheral magnet 42 to the central magnet 41. The point indicated by 81A in FIG. 4 is the central point of the magnet mechanism 4 and is the spin axis of the magnet mechanism 42. The point indicated by 82A is the central point of the target 5 and is revolution axis of the magnet mechanism 42.

Herein, it is considered what trajectories arbitrary points on the magnet mechanism 42, for example, the point a located in the periphery in FIG. 4 and the point P near the spin axis 81A follow during spin and revolution of the magnet mechanism 42. These trajectories are shown in FIGS. 5A to 5C and 6A to 6C, FIGS. 5A to 5C showing the trajectories of the point a, FIGS. 6A to 6C showing the trajectories of the point P.

Figure 5A:
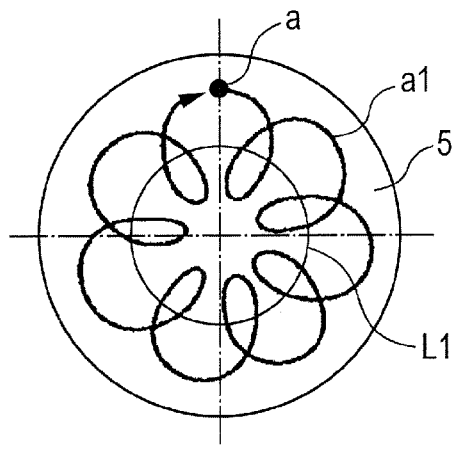
FIG. 5A is a schematic view showing a trajectory of a point a on a magnet mechanism in spin and revolution of the magnet mechanism in this embodiment.
Figure 5B:
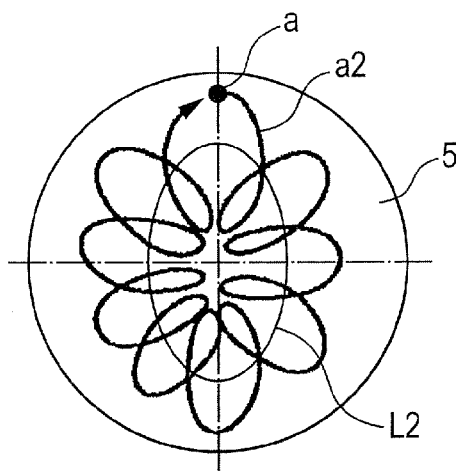
FIG. 5B is a schematic view showing a trajectory of the point a on the magnet mechanism in spin and revolution of the magnet mechanism in this embodiment.
Figure 5C:
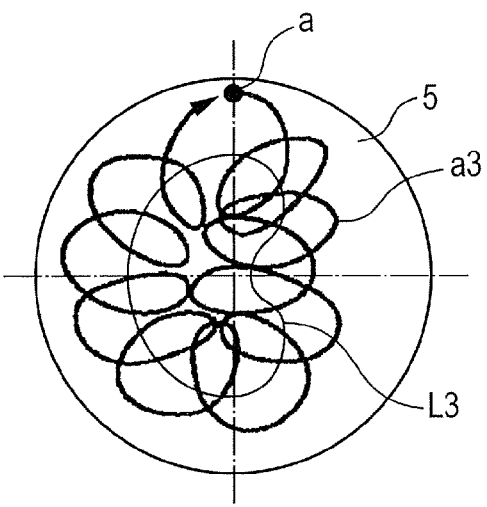
FIG. 5C is a schematic view showing a trajectory of the point a on the magnet mechanism in spin or revolution of the magnet mechanism in this embodiment.

First, FIG. 5A shows the trajectory of the point a when the revolution axis 82A is fixed to be coincident with the central axis of the target and the eccentric distance L of the spin axis 81A from the revolution axis 82A is constant. FIGS. 5B and 5C show the trajectories of the point a when the revolution axis 82A is kept coincident with the central axis of the target by any means while the eccentric distance L is varied. In FIGS. 5A to 5C, a1, a2, and a3 indicate trajectories of the point a, and L1, L2, and L3 indicate trajectories of the spin axis relative to the revolution axis. For convenience of representation in the drawings, the points of origin of the point a in FIGS. 5A to 5C are set at the position 90 degrees counterclockwise from that in the state shown in FIG. 4.

As shown in FIGS. 5B and 5C, when the eccentric distance L is changed, the point a moves in a pattern different from that in the case of the eccentric distance L is not changed. Accordingly, the magnetic field formed by the magnet mechanism 4 rotates in a different pattern.

Figure 6A:
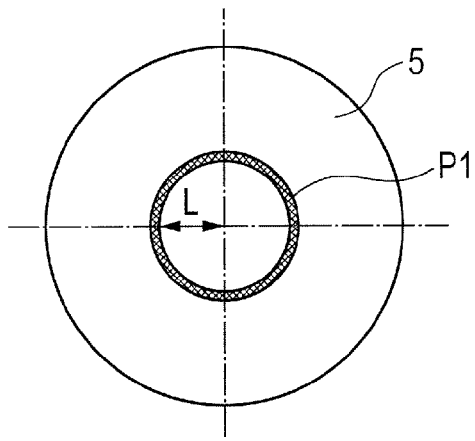
FIG. 6A is a schematic view showing a trajectory of a point P on a magnet unit in spin and revolution of the magnet unit in this embodiment.
Figure 6B:
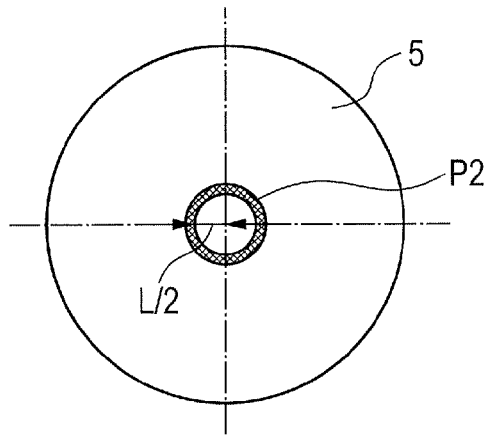
FIG. 6B is a schematic view showing a trajectory of the point P on the magnet unit in spin and revolution of the magnet unit in this embodiment.
Figure 6C:
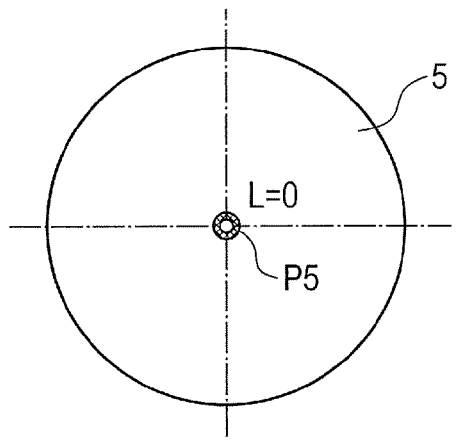
FIG. 6C is a schematic view showing a trajectory of the point P on the magnet unit in spin and revolution of the magnet unit in this embodiment.

Furthermore, FIGS. 6A to 6C show the trajectories of the point P for different values of the eccentric distance L. First, FIG. 6A shows a trajectory P1 of the point P when the eccentric distance L is maximized and the magnet mechanism 4 is caused to spin and revolve without changing the maximum value. FIG. 6B shows a trajectory P2 of the point P when the eccentric distance L is set to half the maximum value. Furthermore, FIG. 6C shows a trajectory P5 of the point P when the eccentric distance L is set to zero, that is, when the magnet mechanism 4 is caused not to revolve by setting the spin axis 81A coincident with the central axis 82A of the target.

As shown in FIGS. 6A to 6C, it is revealed that the point P on the magnet mechanism 4 follows various different trajectories by changing the pattern of change in the eccentric distance L. By properly changing the eccentric distance L of the spin axis 81A from the revolution axis 82A, the point P on the magnet mechanism can follow trajectories of various different patterns. Accordingly, the magnetic field by the magnet mechanism 4 can be rotated in various different patterns.

In the embodiment shown in FIG. 3, arbitrary patterns, which are different from those shown in FIGS. 5A to 5C and 6A to 6C, can be formed by properly selecting the rotation speeds of the spin drive source 814, the revolution drive source 824, and the rotation drive source 834. Accordingly, a desirable pattern of the shape of the rotating magnetic field is previously calculated based on the relationship with a necessary erosion shape, and control signal is sent from the controller 80 to the drive sources 814, 824, and 834 so that the desirable pattern is formed.

By the aforementioned control, even if the surface oxidized layer is formed in the target 5, a suitable pattern of rotating magnetic field is formed on the target 5 for sputter cleaning of the impurity layers on the target 5. Accordingly, with the configuration in which the spin and revolution mechanisms are rotated around a revolution axis different from the spin and revolution axes, the pattern of the magnetic field on the target 5 can be very flexibly changed. The above configuration has an excellent effect in selecting the optimal erosion shape.

Figure 14:
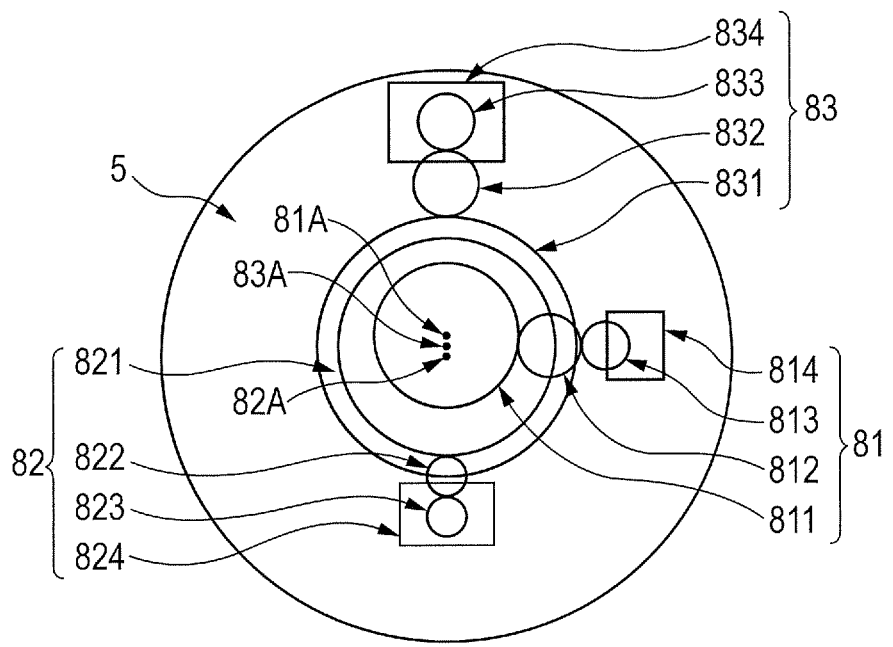
FIG. 14 is a view showing a schematic configuration of an eccentric distance driving mechanism in this embodiment.
Figure 15:
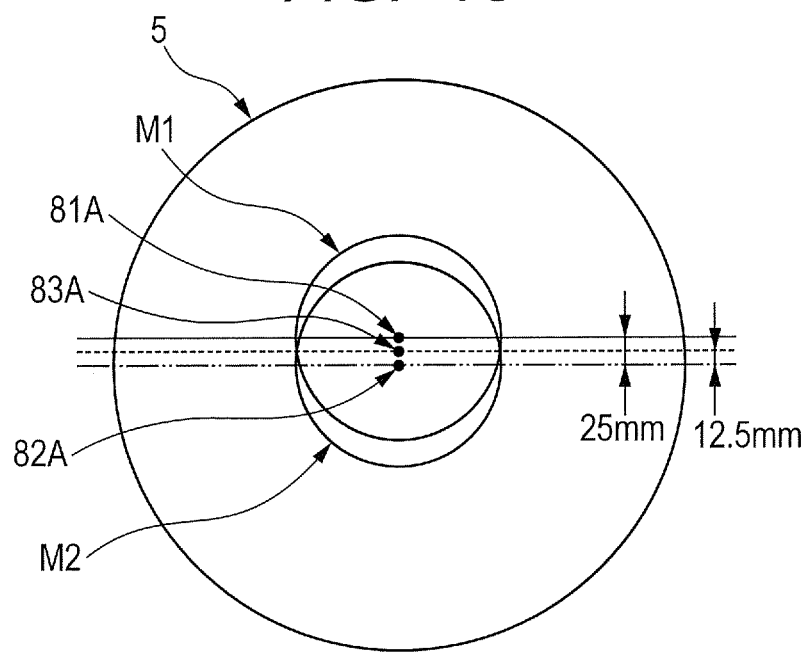
FIG. 15 is a view showing a case where the eccentric distance is changed by using the eccentric distance driving mechanism of this embodiment.

Next, a description is given of the eccentric distance drive mechanism 83 for changing the eccentric distance L between the revolution axis 82A and spin axis 81A using FIGS. 14 and 15. FIG. 14 is a view showing the schematic configuration of the eccentric distance drive mechanism of the embodiment together with the spin and revolution mechanisms 81 and 82. FIG. 14 schematically shows the state of the top view of FIG. 3, but the structure of each gear is simplified for easy understanding. The eccentric distance drive mechanism 83 in FIG. 14 can be implemented as a modification of the rotation mechanism 83 of FIG. 3, and the same reference numerals are used. The spin drive source 814 rotates the holding pole 811 around the spin axis 81A with the spin first and second gears 812 and 813. The revolution drive source 824 rotates the revolution bushing 821 around the revolution axis 82A with the revolution first and second gears 822 and 823. The eccentricity drive source 834 rotates the eccentricity bushing 831 around the eccentric axis 83A with the eccentricity first and second gears 832 and 833. In this mode, the eccentricity axis 83A is located at the midpoint between the spin and revolution axes 81A and 82A, and by rotating at least one of the spin and revolution axes 81A and 82A around the eccentricity axis 83A, the eccentric distance L of between the spin axis 81A and revolution 82A can be changed. The magnet mechanism (magnet unit) 4 can be therefore set eccentric (in the state where the central positions of the target and the magnet unit of the magnet mechanism 4 are separated from each other).

FIG. 15 is a view showing a change in movement of the magnet mechanism 4 when the eccentric distance is changed by the eccentric distance drive mechanism of the embodiment. In FIG. 15, the eccentricity axis 83A is located at the midpoint between the spin and revolution axes 81A and 82A, and the distance between the eccentricity axis 83A and spin axis 81A and the distance between the eccentricity axis 83A and the revolution axis 82A are both set to 12.5 mm. In this state, the eccentric distance L is 25 mm. M1 indicates a trajectory of a certain point on the magnet mechanism 4 when the magnet mechanism 4 is spun with an eccentric distance set to 25 mm. Furthermore, by rotating the spin axis 81A around the eccentricity axis 83A, the spin axis 81A and the revolution axis 82A can be set coincident with each other. In a state where the spin axis 81A is coincident with the revolution axis 82A, the eccentric distance is 0 mm. M2 indicates a trajectory of a certain point on the magnet mechanism 4 when the magnet mechanism 4 spins with the eccentric distance set to 0 mm.

[Cleaning Operation and Configuration]

Next, a description is given of target cleaning operation of the embodiment.

Figure 9:
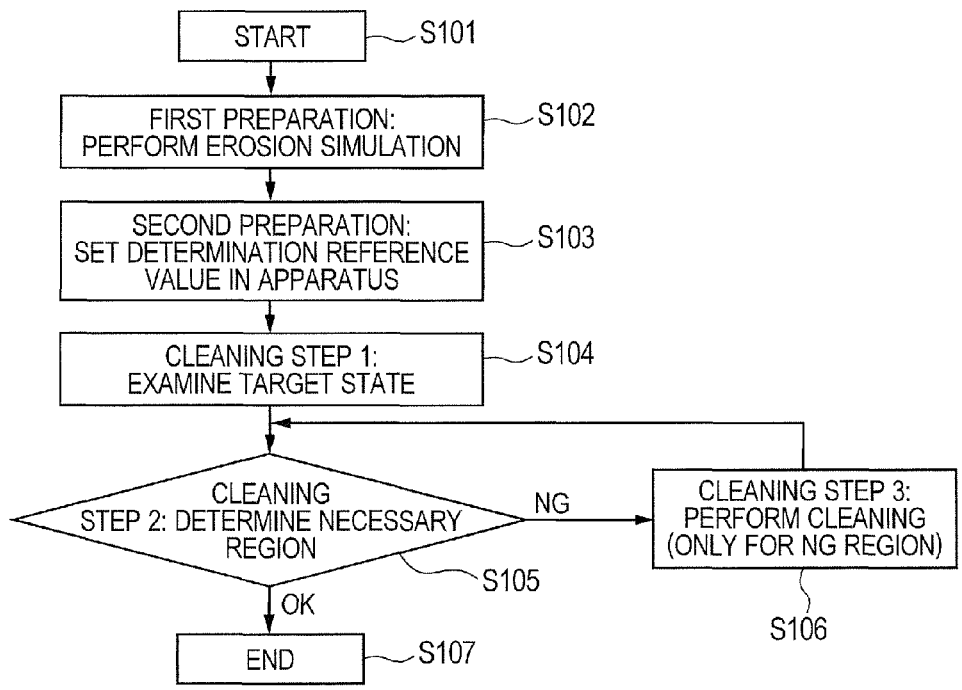
FIG. 9 is a flowchart showing a sputter cleaning process of this embodiment.

FIG. 9 shows a flowchart showing the target cleaning operation.

The inventor found that when the target is clean, the discharge state value (the target current value in an example of FIG. 8) was saturated to a value different from that when re-deposited substances or oxides remain on the target.

Figure 8:
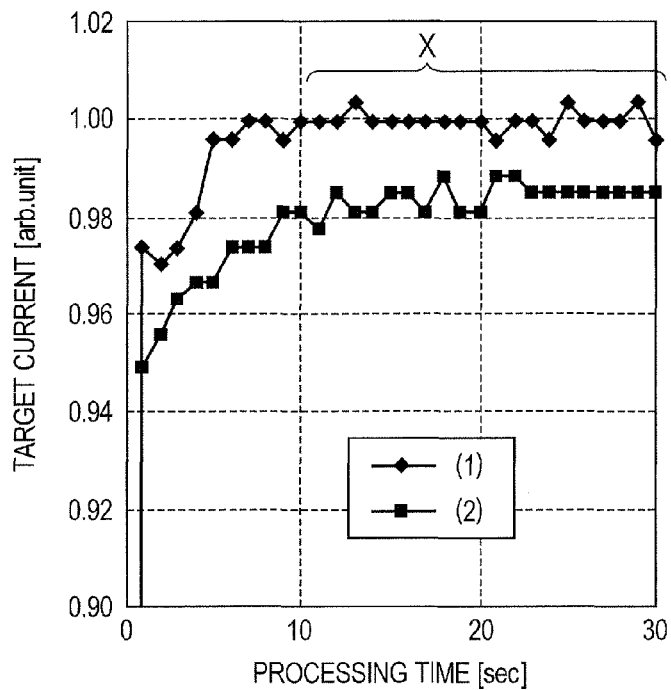
FIG. 8 is a graph showing time transition of discharge state values.

In FIG. 8, the horizontal axis of the graph represents time elapsed after power is applied to the target electrode and the vertical axis thereof represents values of ion current flowing into the target electrode (also referred to as a target current value). (1) of FIG. 8 shows transition of the measured value of ion current after power starts to be applied to the target electrode when the surface of the target is clean. The value of ion current tends to be gradually saturated over a period of time after power starts to be applied to the target electrode 2. The period when the current value is saturated referred to as a convergence time X. (2) of FIG. 8 shows the measured value of ion current after the target in the state of (1) is used for a lot of deposition and is then exposed to the atmosphere. In (2) of FIG. 8, similar to the case of (1) of FIG. 8, the value of ion current tends to be gradually saturated in a certain period of time. However, the saturated value of ion current is about 2% lower than that of (1) of FIG. 8. This is because re-deposited film of the target material and the like are formed at a predetermined place of the surface of the target to reduce the ion current flowing to the surface of the target.

Figure 16A:
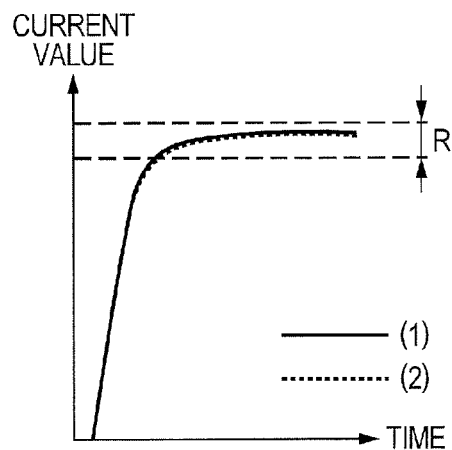
FIG. 16A is a graph showing time transition of discharge state value with varying distance between axes of spin and revolution of the magnet unit in this embodiment.
Figure 16B:
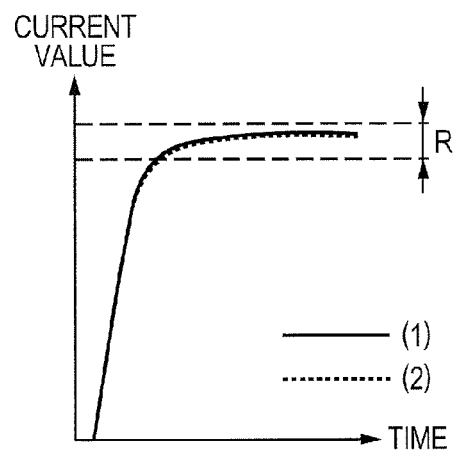
FIG. 16B is a graph showing time transition of values of the discharge state with varying distance between the axes of spin and revolution of the magnet unit in this embodiment.
Figure 16C:
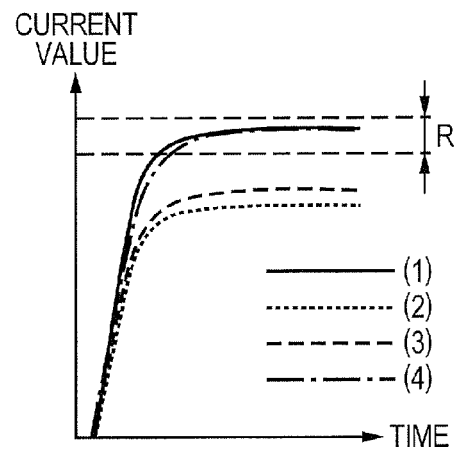
FIG. 16C is a graph showing time transition of values of the discharge state with varying distance between the axes of spin and revolution of the magnet unit in this embodiment.
Figure 17:
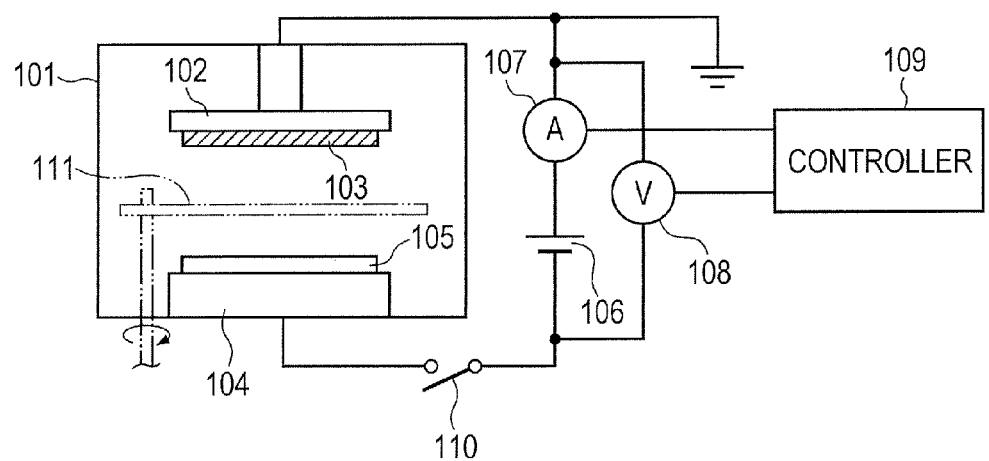
FIG. 17 is a schematic configuration view of a conventional sputtering apparatus (Patent Document 3).

Furthermore, it was revealed that the change in the aforementioned convergence value depended on the magnetic field pattern formed by the magnet unit. Specifically, in the case of discharge in a certain magnetic field pattern, the convergence value of the target current is equal to that in the case of sputtering with a clean target. However, the convergence value of the target current with a clean target is sometimes different from that in the case of discharge to the same target in a different magnetic field pattern. Herein, the magnetic field pattern refers to conditions of the magnetic field formed on the target surface by the magnet unit, including the position and intensity. The magnetic field pattern therefore changes when the magnet unit is rotated or moved in parallel. FIGS. 16A to 16C are diagrams showing how the change in target current value due to the target surface state varies depending on the position of the magnet unit 4. FIG. 16A shows a case of the relationship in which the eccentric distance and angle between the spin axis 81A and revolution axis 82A of the magnet unit 4 are 0 mm and 0 degree, respectively (called a magnet position A). FIG. 16B shows a case of the relationship in which the eccentric distance and angle between the spin axis 81A and revolution axis 82A of the magnet unit 4 are 16 mm and 0 degree, respectively (called a magnet position B). FIG. 16C shows a case of the relationship in which the eccentric distance and angle between the spin axis 81A and revolution axis 82A of the magnet unit 4 are 10 mm and 180 degree, respectively (called a magnet position C).

Figure 10:
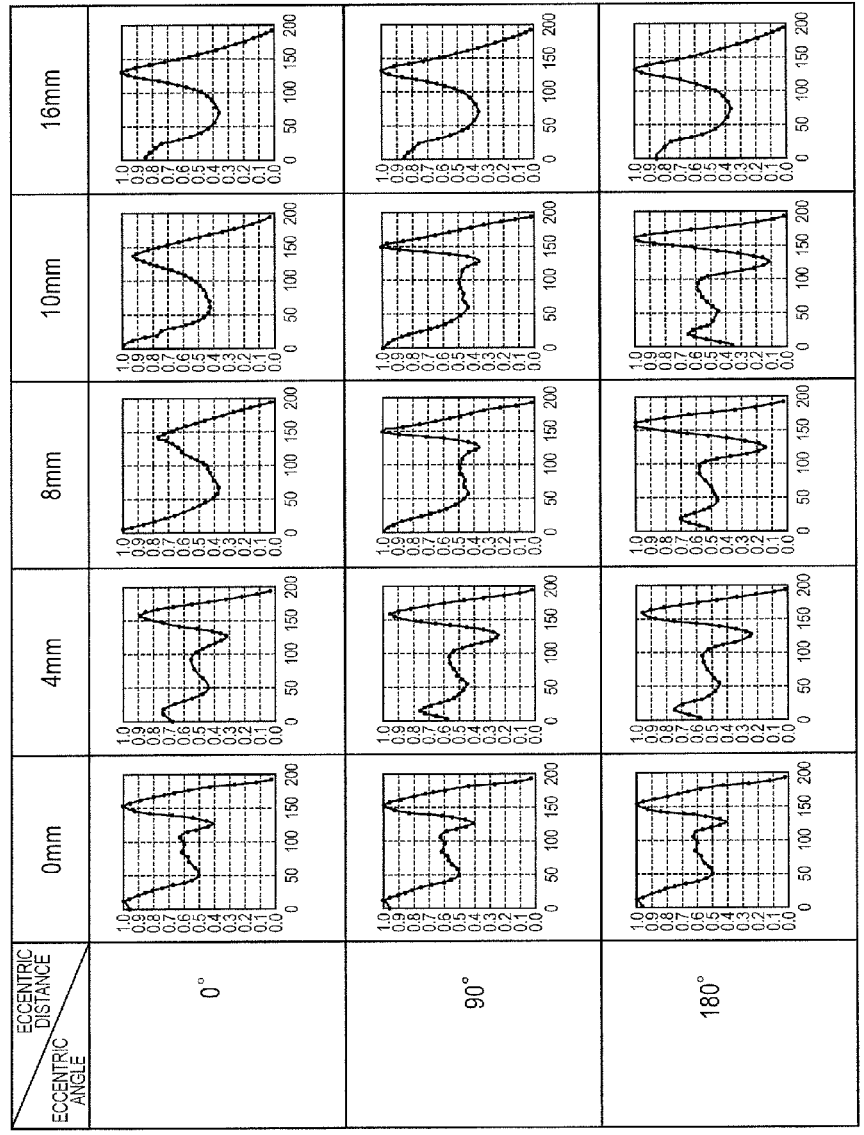
FIG. 10 is a table showing states of target erosion with varying eccentric angle and distance of the magnet unit in this embodiment.

FIG. 10 is a table showing erosion patterns previously acquired by performing erosion simulation with varying eccentric distance and angle. The horizontal axis of each diagram included in FIG. 10 represents the distance from the target center, and the vertical axis thereof represents the erosion depth ratio in the target surface. The erosion depth ratio is a ratio of erosion depth where the erosion depth ratio of a part of the target surface most deeply removed is set to 1.0 and the erosion depth ratio of a part of the target surface not removed at all is set to 0.0. The target erosion pattern of the magnet position A corresponds to a diagram of FIG. 10 with an eccentric distance of 0 mm and an eccentric angle of 0 degree. The target erosion pattern of the magnet position B corresponds to a diagram of FIG. 10 with an eccentric distance of 16 mm and an eccentric angle of 0 degree. The target erosion pattern of the magnet position C corresponds to a diagram of FIG. 10 with an eccentric distance of 10 mm and an eccentric angle of 180 degrees.

The inventor found that, when the magnet position of the magnet unit 4 was changed, the target current value in the state where re-deposited substances, oxide, and the like remained on the target ((2) of FIGS. 16A to 16C) after the target is used was within a normal range R (a range not requiring pre-sputtering) in some cases and was out of the normal range R (a range requiring pre-sputtering) in the other cases. Specifically, in the case of the magnet positions A and B of FIGS. 16A and 16B, the target after use ((2) of FIGS. 16A and 16B) is within the normal range R, and the target cleaning is unnecessary. In the case of the magnet position C of FIG. 16C, the target after use ((2) of FIG. 16C) is out of the normal range R, and the target cleaning is therefore necessary. Herein, if the target current values are measured using new (unused) targets having clean surfaces ((1) of FIGS. 16A to 16C), each target current value is within the normal range R. The normal range R refers to a range of +/−2% around the target current value when the target is unused (discharge reference value). This is because the target current having a value out of this range causes various problems adversely affecting the device characteristics, including degradation of the thickness distribution of film deposited on a wafer, degradation of the distribution of specific electric resistance, and dust from the target surface.

Patent Document 3 does not consider the case where the distance between the spin and revolution axes of the magnet unit 4 is changed, that is, the case where the magnet position of the magnet unit 4 is changed. Accordingly, as shown in Patent Document 3, the necessity of pre-sputtering cannot be determined only by monitoring at least one of the current and voltage values between the target and substrate.

(First Preparation)

When the processing is started (Step S101 of FIG. 9), which one of the target erosion distributions shown in FIG. 10 each of the magnet positions A to C shown in FIGS. 16A to 16C corresponds to, that is, which one of erosion patterns of FIG. 10 previously acquired by erosion simulation each magnet position to be examined corresponds to, is confirmed and is then stored in the memory unit (step S102 of FIG. 9).

(Second Preparation)

Next, the target current value of each of the magnet positions shown in FIGS. 16A to 16C is measured in a clean surface of a new target. For the new target is clean, the measured current value is used as a reference of determination whether the target surface is clean, that is, whether cleaning is necessary (step S103).

(Cleaning Steps 1 and 2)

Next, in a state where the target 5 is used to a certain degree (in a state where impurity layers are formed on the surface of the target 5), any place requiring cleaning is found in such a way that the magnet position is set to A, B, and C while the target current value of each magnet position is measured (steps S104 and S105). Specifically, as the target is used, the target surface includes regions with high target current value and regions with low target current value. This is because, in some places of the target surface, nodule (re-deposited film) is sometimes deposited, and under the influence thereof, the target current value is reduced. Herein, any number of patterns of the magnet positions may be examined, but in this embodiment, the three magnet positions A, B, and C are examined. In the case of the magnet positions A and B shown in FIGS. 16A and 16B, the target current value after use is within the normal range, and the target cleaning is unnecessary (step S107)

(Cleaning Step 3)

In the case of the magnet position C shown in FIG. 16C, the target current value after use is out of the normal range. It is therefore determined that the target cleaning is necessary, and cleaning step 3 is carried out (step S106 in FIG. 9). The target erosion pattern obtained by sputtering process at the magnet position C shown in FIG. 16C corresponds to a diagram of FIG. 10 with an eccentric distance of 8 mm and an eccentric angle of 180 degrees. In the case of the magnet position C shown in FIG. 16C, the inventors found that nodule (re-deposited film) tended to be deposited especially on the part having an erosion depth ratio of not more than 0.3. Accordingly, the part having an erosion depth ratio of not more than 0.3 needs to be cleaned and removed more than the part having an erosion depth ratio of more than 0.3. In the cleaning step 3, an erosion pattern that can be cancelled out with the target erosion pattern in the case of the magnet position C is selected, and the magnet unit is changed to a magnet position corresponding to the selected erosion pattern. The erosion pattern that can be cancelled out with the target erosion pattern in the case of the magnet position C corresponds to a diagram of FIG. 10 with an eccentric distance of 16 mm and an eccentric angle of 0 degree (that is, the state of the magnet position B). Accordingly, the position of the magnet mechanism is changed to the magnet position B for execution of the cleaning process 3. (4) of FIG. 16C shows the target current value when the cleaning step 3 is performed after the magnet position is changed to the magnet position B, which can cancel out the erosion pattern with the magnet position C, showing that the target current value is back within the normal range R. On the other hand, (3) of FIG. 16C shows the target current value when the cleaning step 3 is performed after the magnet position is changed to the magnet position A, which cannot cancel out the erosion pattern with the magnet position C, showing that the target current value is not back to the normal range R.

Figure 7A:
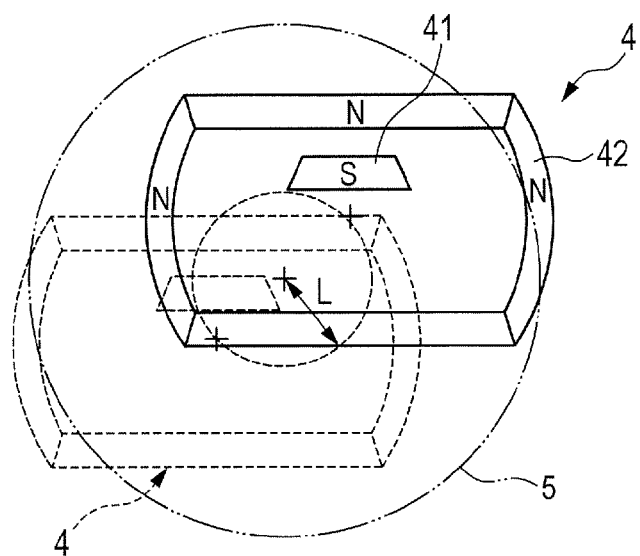
FIG. 7A is a view for explaining eccentric angle and distance.
Figure 7B:
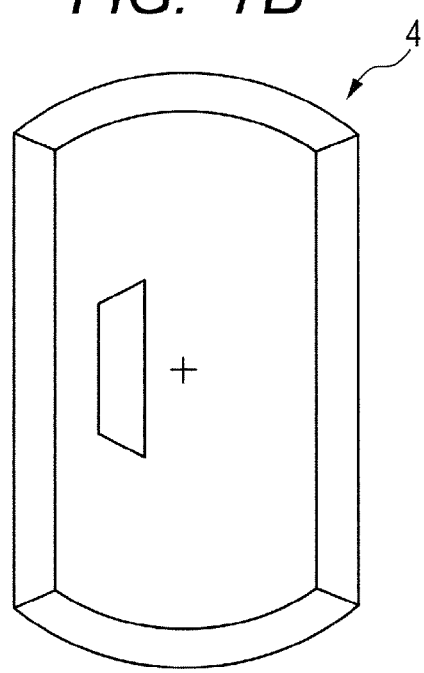
FIG. 7B is a view for explaining the eccentric angle and distance.

In the cleaning step 3, the drive conditions of the magnet unit 4 are previously determined as described above. The control apparatus 300 outputs drive signal including the determined drive conditions to the controller 80 of the rotary system 8, and rotary system 8 is driven based on the inputted drive conditions, so that a predetermined magnetic field pattern is implemented. The cleaning step 3 uses the aforementioned eccentric distance L and angle as the drive conditions. As shown in FIGS. 7A and 7B, when the eccentric angle is set to a value other than 0 degree, the magnet unit 4 revolves while keeping the predetermined position. This can be implemented by spinning the magnet unit 4 one time while revolving the same one time (in other words, by setting the revolution period equal to the spin period). FIG. 7A shows the state of the magnet unit 4 when the eccentric distance and angle are L and 180 degrees, respectively. FIG. 7B shows the state of the magnet unit 4 when the eccentric distance and angle are L and 90 degrees, respectively.

In the cleaning step 1, as described above, the value of current flowing through the target electrode 2 is acquired as the discharge state value by the ammeter 59 shown in FIG. 1. The discharge state value may be the direct-current component or peak-to-peak value of the target potential in addition to the current flowing through the target electrode 2.

In the cleaning step 2, it is determined that cleaning is necessary when the difference between the reference value and a measured value is 2% or more. Desirably, this reference value is optimized depending on the target material.

Back in FIG. 9, in the cleaning step 2 (step S105), it is determined whether the cleaning step 3 is finished. If it is determined by first cleaning step 2 that the target is not yet cleaned for one time (step S105), the cleaning step 3 is performed for the second time under different drive conditions (step S106). The way of determining the drive conditions of the second cleaning step 3 in the step S106 is not particularly limited. For example, when the first cleaning step 3 is performed with the magnet position B shown in FIG. 16, the second cleaning step 3 is performed with the magnet position changed to the eccentric distance and angle providing an erosion pattern that can cancel out the target erosion pattern in the case of the magnet position B.

Hereinafter, until no part is found in the target where it is determined that cleaning is insufficient, the aforementioned cleaning steps 2 and 3 are repeated for only the necessary part (the steps S105 and S106). In the cleaning step 2 for the second and subsequent times, since the first cleaning step 3 is already finished, discharge may be performed with the applied power reduced for the purpose of obtaining the effect of detecting whether the target is sufficiently cleaned. In this case, different discharge reference values may be provided for the process of sputter cleaning and the process of cleanup detection.

Figure 11:
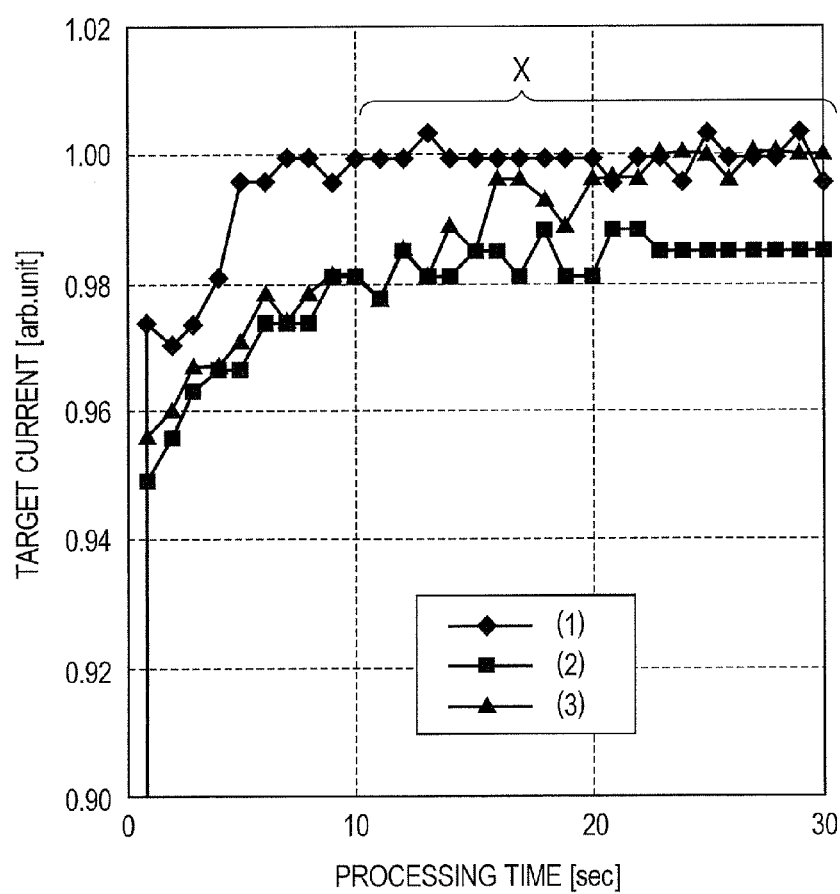
FIG. 11 is a diagram showing transition of values of ion current flowing into the target electrode at sputter cleaning in this embodiment.

(1) of FIG. 11 shows processing time of a clean target and transition of the target current value, (2) of FIG. 11 shows processing time after chamber maintenance (exposure to the atmosphere) and transition of the target current value.

(3) of FIG. 11 shows transition of the ion current value after sputter cleaning is performed under the combination of the target 5 shown in (2) of FIG. 11 and such drive conditions of the magnet unit 4 that the impurity layers on the aforementioned target 5 can be efficiently sputter-cleaned. Similarly to (1) and (2) of FIG. 11, the ion current value tends to be saturated in a certain period of time, the saturated ion current value is equal to that of (1) of FIG. 11. This is because the re-deposited film formed on the surface of the target 5 and the like are removed to increase the value of ion current flowing to the target electrode 2. Specifically, (3) of FIG. 11 shows that sputter cleaning is performed in a state where impurity layers are formed at a predetermined position of the surface of the target 5 and the impurity layers on the target 5 can be efficiently sputter-cleaned.

As shown in the above embodiment, the cleaning steps 2 and 3 do not need to be separated, and whether cleaning is necessary may be determined at each cleaning step. Moreover, the cleaning steps 2 and 3 may be alternately performed on a bases of drive conditions.

[Modification]

Figure 12:
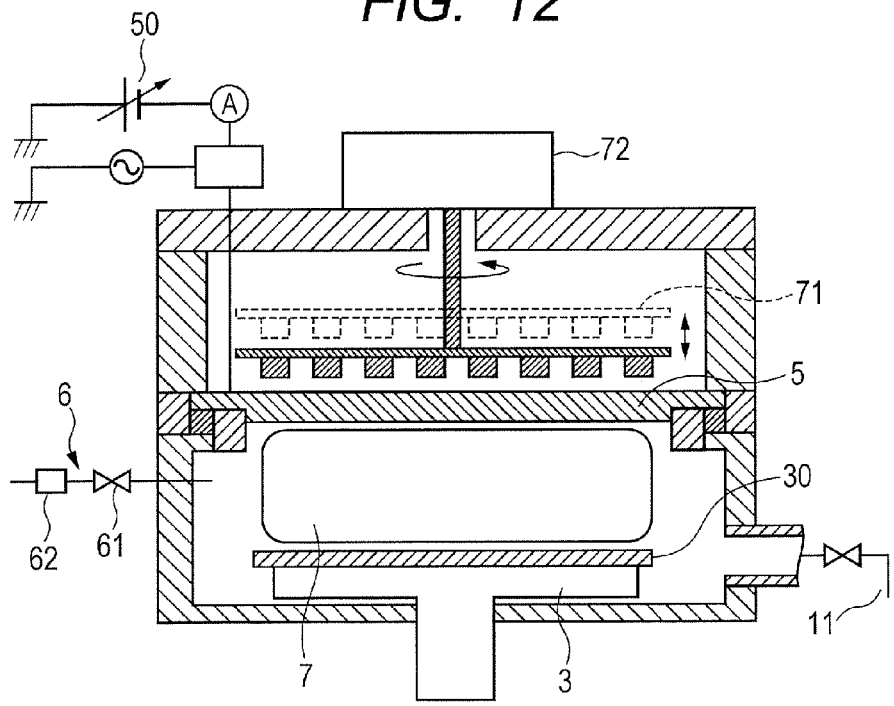
FIG. 12 is a schematic configuration view of a sputtering apparatus of a modification.

Moreover, the embodiment is not limited to the drive mechanism having the above-described eccentricity mechanism as long as the erosion pattern can be changed by the magnet arrangement, and the magnetic field pattern may be changed by changing the distance between the target 5 and a magnet unit 71 as shown in FIG. 12. In the sputtering apparatus shown in FIG. 12, the magnet unit 71 is configured to move vertically and be rotatably driven by a drive apparatus 72. The magnet unit 71 is brought closer to or away from the target 5. Sputter cleaning is performed in each case, and the discharge state value is compared with the discharge reference value for determination whether the target is clean.

Figure 13:
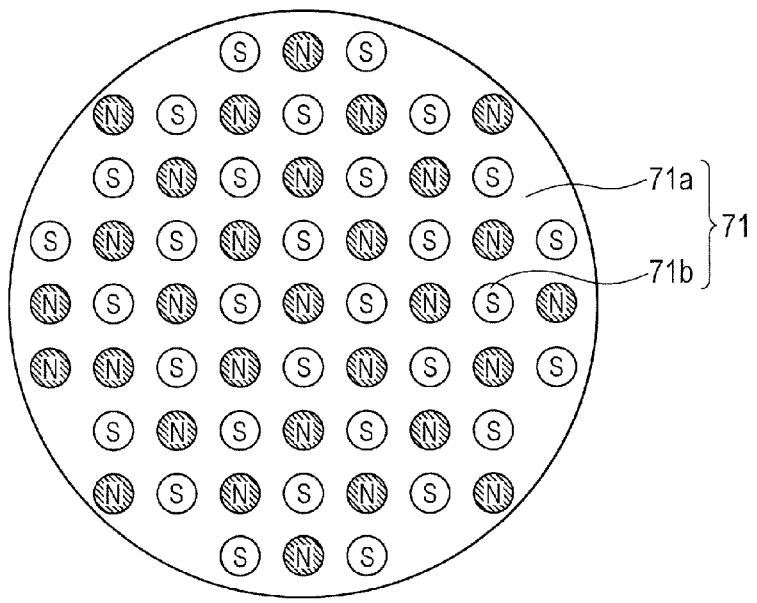
FIG. 13 is a plan view of a magnet unit of another modification.

FIG. 13 is a plan view of a magnet unit 72 (a view from the target side), in which magnet pieces 71b, which are magnetized in the direction intersecting the face of the magnet attachment board 71a, are arranged in a lattice fashion so that adjacent pieces 71b have different polarities.

The invention claimed is:

1. A method of cleaning using a sputtering apparatus, the sputtering apparatus comprising a magnet unit capable of forming a magnetic field on a surface of a target, a changing unit capable of driving the magnet unit to change a magnetic field pattern including a position and intensity of the magnetic field formed on the surface of the target, a discharge state measuring unit configured to measure a discharge state value when discharge voltage is applied to a target electrode to which the target is attached, and a memory unit configured to store a reference discharge state value acquired corresponding to each magnetic field pattern producible by the changing unit, the method comprising:

a first step of determining, after forming a film on a substrate with a first magnetic field pattern, a state of the surface of the target based on a comparison between the discharge state value measured by the discharge state measuring unit after the forming of the film with the first magnetic field pattern and a discharge state reference value before the forming of the film corresponding to the first magnetic field pattern stored in the memory unit; and a second step of cleaning comprising selecting a second magnetic field pattern, which is different from the first magnetic field pattern, based on a determination result at the first step, controlling the changing unit to produce the second magnetic field pattern, and executing sputter cleaning re-deposited substances or oxides on the surface of the target, wherein, the first step further comprises measuring current flowing through the target as the discharge state value by the discharge state measuring unit and determining whether the current measured by the discharge state measuring unit is out of a range of 98 to 102% of a target current value when the target is unused, and the sputter cleaning is executed in the second step if the current measured by the discharge state measuring unit is out of the range of 98 to 102% of the target current value when the target is unused.

2. The method of cleaning using the sputtering apparatus according to claim 1, wherein, at the second step, the second magnetic field pattern is selected so that an erosion pattern in which the surface of the target is removed with the first magnetic field pattern cancels out an erosion pattern in which the surface of the target is removed with the second magnetic field pattern.

3. The method of cleaning using the sputtering apparatus according to claim 1, wherein a discharge power at the first step at measurement of a discharge state value by the discharge state measuring unit is smaller than a discharge power at the second step at execution of sputter cleaning based on the determination result at the first step.

4. The method of cleaning using the sputtering apparatus according to claim 1, wherein the changing unit revolves the magnet unit around the central axis of the target at discharge to form a magnetic field moving along the target and changes the radius of the revolution to change the magnetic field pattern.

5. The method of cleaning using the sputtering apparatus according to claim 1, wherein the changing unit changes a distance between the magnet unit and the target to change the magnetic field pattern.

6. The method of cleaning using the sputtering apparatus according to claim 1, wherein the discharge state reference value stored in the memory unit is a discharge state value measured by the discharge state measuring unit using an unused target.

7. The method of cleaning using the sputtering apparatus according to claim 1, wherein the first step further comprises determining that sputter cleaning for the target is required when the discharge state value is out of a predetermined range around the discharge state reference value.

8. The method of cleaning using the sputtering apparatus according to claim 1, wherein the changing unit is capable of positioning the magnet unit at a first position and is capable of positioning the magnet unit at a second position, which is a position rotated from the first position by a predetermined angle around the spin axis.

9. The method of cleaning using the sputtering apparatus according to claim 1, wherein the changing unit comprises:
   a spin mechanism configured to rotate the magnet unit around a spin axis, which is coincident with a central axis of the magnet unit;
   a revolution mechanism configured to rotate the magnet unit around a revolution axis, which is coincident with a central axis of the target; and
   a rotation mechanism configured to rotate the spin mechanism and the revolution mechanism around a rotation axis different from the spin axis and revolution axis, the rotation axis being located at the midpoint between the spin axis and the revolution axis, and
   wherein the changing unit changes the magnetic field pattern by rotating at least one of the spin axis and the revolution axis around the rotation axis to change an eccentric distance between the spin axis and the revolution axis.

10. The method of cleaning using the sputtering apparatus according to claim 1, wherein the magnetic field pattern comprises conditions of the magnetic field formed on the target surface by the magnet unit, and
   the conditions include the position and the intensity of the magnetic field.

* * * * *